(12) United States Patent
Ritter et al.

(10) Patent No.: US 10,028,372 B2
(45) Date of Patent: Jul. 17, 2018

(54) MULTI-LAYER HEAT SPREADER ASSEMBLY WITH ISOLATED CONVECTIVE FINS

(71) Applicant: THOMSON LICENSING, Issy les Moulineaux (FR)

(72) Inventors: Darin Bradley Ritter, Indianapolis, IN (US); Mark Robert Anderson, Indianapolis, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 32 days.

(21) Appl. No.: 14/912,158

(22) PCT Filed: Jul. 31, 2014

(86) PCT No.: PCT/US2014/049110
§ 371 (c)(1),
(2) Date: Feb. 15, 2016

(87) PCT Pub. No.: WO2015/023447
PCT Pub. Date: Feb. 19, 2015

(65) Prior Publication Data
US 2016/0205762 A1    Jul. 14, 2016

Related U.S. Application Data

(60) Provisional application No. 61/866,776, filed on Aug. 16, 2013, provisional application No. 61/993,601, filed on May 15, 2014.

(51) Int. Cl.
*H05K 7/20* (2006.01)
*H05K 1/02* (2006.01)

(52) U.S. Cl.
CPC ....... *H05K 1/0203* (2013.01); *H05K 7/20409* (2013.01); *H05K 7/20436* (2013.01)

(58) Field of Classification Search
None
See application file for complete search history.

(56) References Cited

U.S. PATENT DOCUMENTS

| 3,961,666 | A | 6/1976 | Suzuki et al. | |
| 6,864,573 | B2* | 3/2005 | Robertson | H01L 23/4093 257/718 |
| 7,019,974 | B2* | 3/2006 | Lee | G06F 1/20 165/104.21 |
| 7,588,074 | B1 | 9/2009 | White | |
| 7,990,726 | B2* | 8/2011 | Izuhara | H05K 7/20563 165/80.4 |
| 8,422,231 | B2* | 4/2013 | Huang | H05K 7/20218 174/520 |
| 9,073,123 | B2* | 7/2015 | Campbell | B22F 3/225 |

(Continued)

OTHER PUBLICATIONS

Search Report dated Oct. 31, 2014.

*Primary Examiner* — Courtney Smith
(74) *Attorney, Agent, or Firm* — Jerome G. Schaefer; Richard Laperuta

(57) ABSTRACT

An assembly of two or more heatspreaders is attached to a printed circuit board in a compact electronic enclosure. The heatspreaders include fins which assist in convecting heat out of the enclosure through vents. The printed circuit board is shielded from the outer case by the heatspreaders.

12 Claims, 10 Drawing Sheets

(56) References Cited

U.S. PATENT DOCUMENTS

| | | |
|---|---|---|
| 2006/0082973 A1* | 4/2006 | Egbert .............. H05K 7/20154 |
| | | 361/709 |
| 2009/0236626 A1 | 9/2009 | Xiao et al. |
| 2010/0008025 A1 | 1/2010 | Nemoz et al. |
| 2010/0097767 A1 | 4/2010 | Jude et al. |
| 2010/0315252 A1 | 12/2010 | Desphande et al. |
| 2011/0194253 A1 | 8/2011 | Momose |
| 2012/0155015 A1* | 6/2012 | Govindasamy ......... G06F 1/203 |
| | | 361/679.46 |
| 2013/0063895 A1 | 3/2013 | Ritter et al. |

\* cited by examiner

MULTI-LAYER HEAT SPREADER ASSEMBLY WITH ISOLATED CONVECTIVE FINS

CROSS-REFERENCE TO RELATED APPLICATIONS

This application claims the benefit, under 35 U.S.C. § 365 of International Application PCT/US2014/049110, filed Jul. 31, 2014, which was published in accordance with PCT Article 21(2) on Feb. 19, 2015 in English and which claims the benefit of U.S. Provisional Patent Application No. 61/866,776, filed Aug. 16, 2013 and claims the benefit of U.S. Provisional Patent Application No. 61/993,601, filed May 15, 2014, which are incorporated by reference herein in its entirety.

FIELD OF THE INVENTION

The present principles relate generally to electronic devices and, more particularly, to a heat sink attachment apparatus and method for an electronic device.

BACKGROUND OF THE INVENTION

Managing heat in compact electronic enclosures is difficult because the aesthetic and performance demands from customers cause the enclosures to be form fit to the electronic components with little room for natural convection to dissipate heat. Usually, the integrated circuits (ICs) generating the largest amount of heat are located in the center of the enclosure and many customers object to vent openings in the enclosure directly above the printed circuit board (PCB). This causes the heat to be trapped in the enclosure and can damage sensitive components. Also, the outer surfaces of the enclosure can exceed temperature limits acceptable for a customer's touch.

Numerous approaches for managing heat exist. Some involve employing a plurality of vent openings and providing sufficient space in enclosures conducive to exhaust heat. However, many customers object to large enclosure sizes and excessive openings. Heatspreaders are commonly used in compact electronic enclosures to radiate heat into the walls of the enclosure but their dissipation of heat is limited. Finned heatsinks have been used in larger enclosures that allow movement of air through vents. In systems with finned heatsinks, there has to be enough room for air to circulate, and as such, this requirement generally causes the need for larger enclosures. Fans and blowers are used widely, but they generate noise that is objectionable to many customers. Fluid filled heat pipes have been used to transfer heat from the center of enclosures, but such an approach is expensive.

In most typical set top boxes, the PCB assemblies have components and connectors mounted on one side of the PCB in which there is an aesthetic motivation to form fit the enclosures to the components. This usually places one side of the enclosure close to the PCB and the other relatively farther away. This makes it useful to be able to draw heat in some directions through conduction and to shield radiation from the enclosure in others; however, this causes the need for the set top box to have additional height.

It is thus recognized that a further need exists to implement set top box designs which efficiently eliminate heat and which are compact, quiet, and cost effective.

SUMMARY OF THE INVENTION

An electronic device 10 is provided that comprises a printed circuit board 4; a first heatspreader 1 having a first plate portion 30 and first fins 8T along two sides of the first plate portion, the first plate portion being above the printed circuit board; and a second heatspreader 3 having a second plate portion 31 and second fins 8B along two sides of the second plate portion, the second plate portion being below the printed circuit board. The electronic device can include a smart card assembly 5 in which one of the heatspreaders has a cutout portion in the corresponding plate portion and the smart card assembly is positioned in the cutout portion. The electronic device can further include a third heatspreader 1a having a third plate portion that has additional fins 8TT along one side of the third plate portion in which the third plate portion is positioned in the cutout portion. The electronic device can further include exterior sides 16 and at least one of the exterior sides can have at least one vent 15 positioned adjacent to at least one of the fins.

Additionally, an electronic device 10 is provided that comprises a printed circuit board 4; a first heatspreader 1 having a first plate portion 30 and first fins 8T along two sides of the first plate portion, the first plate portion 30 being above the printed circuit board; a second heatspreader 3 having a second plate portion 31 and second fins 8B along two sides of the second plate portion, the second plate portion being below the printed circuit board; and a third heatspreader 1a having a third plate portion that is positioned in a cutout portion in the first plate portion. The electronic device can further include additional fins 8TT along one side of the third plate portion.

In the embodiments of the invention, the first fins and/or second fins can be oriented vertically and be parallel to each other. With such an orientation, a plurality of the first and second fins can alternate with one another along both sides of the first and second plate portions.

In the embodiments, the electronic device can have a plurality of the vertical exterior sides 16 having at least one vent 15 positioned adjacent to the fins, wherein the vents are oriented perpendicularly to the fins. These embodiments can include a top 29 and bottom 2 of the electronic device in which two opposing exterior vertical sides and edge portions of the top and bottom adjacent the opposing exterior vertical sides have a plurality of vents 15 positioned adjacent to the fins such that the vents are oriented perpendicularly to the fins. Additionally, the bottom 2 can have second vents 17 between the first vents in which the first vents 15 can be elongated and can be perpendicular to the fins and the second vents can be elongated and can be parallel to the fins.

BRIEF DESCRIPTION OF THE DRAWINGS

The invention will be explained in greater detail with reference to embodiments, referring to the appended drawings, in which.

DETAILED DESCRIPTION OF THE INVENTION

The embodiments generally include an assembly of two or more heat spreaders attached to a PCB in a compact electronic enclosure in which it is preferable to select materials for the heatspreader that have higher conductivities such as aluminum.

As needed, for particular components to which the heatspreaders are attached, thermally conductive elastic pads can be employed.

The invention will now be described in greater detail wherein embodiments of the present invention are illustrated in the accompanying drawings. It should be noted that the expression heatspreader and heatsink are used interchangeably throughout the specification and that the embodiments of the invention can employ heatspeaders and/or heatsinks. Heatspreaders are understood to be a structure that extracts heat from hot components by thermal conduction and then permits the heat to be released and/or spread by convention and radiation in a diffuse manner. Heatsinks are understood to be a structure having sufficient mass that also extracts heat from hot components by thermal conduction such that the heatsinks effectively absorb heat from hot components.

Figure 1:
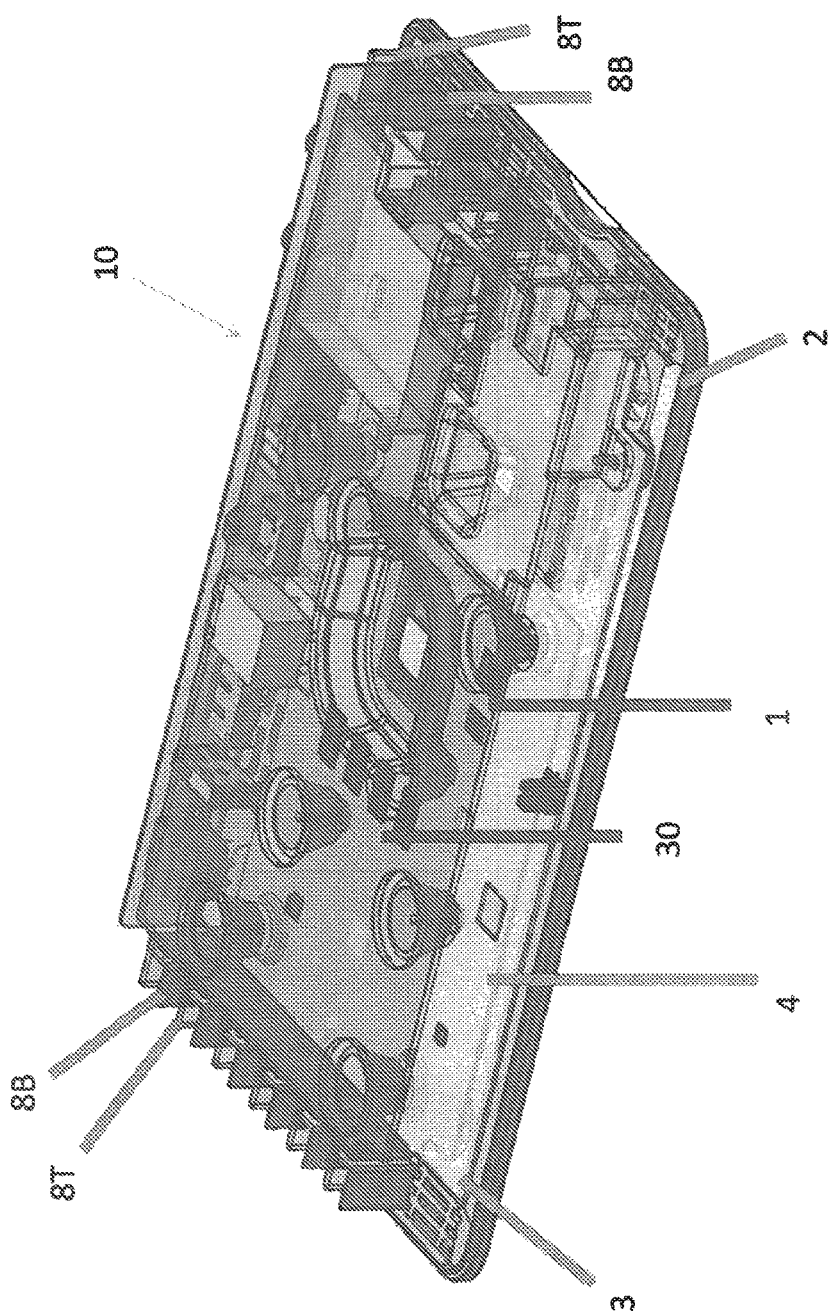
FIG. 1 is an interior top front perspective view of the set top box 10 according to the invention.

FIG. 1 is a top front perspective view with some see-through features of the electronic device 10 such as a set top box or the like according to the invention. The top, front side, left side and right side are removed to more clearly show the interior features. The electronic device 10 includes a printed circuit board 4; a first heatspreader 1 having a first plate portion 30 and first fins 8T along two sides or edges of the first plate portion in which the first plate portion 30 is above the printed circuit board; a second heatspreader 3 having a second plate portion 31 and second fins 8B along two sides or edges of the second plate portion in which the second plate portion is below the printed circuit board. In this embodiment and others, screws can be driven through embosses in the heatspreaders and holes in the PCB. The screw threads can be driven into the heatspreader embosses or into plastic bosses in the enclosure. At particular locations, one heatspreader only, or combinations of other heatspreaders can be attached to the PCB, depending on the needed conduction of heat.

Figure 2:
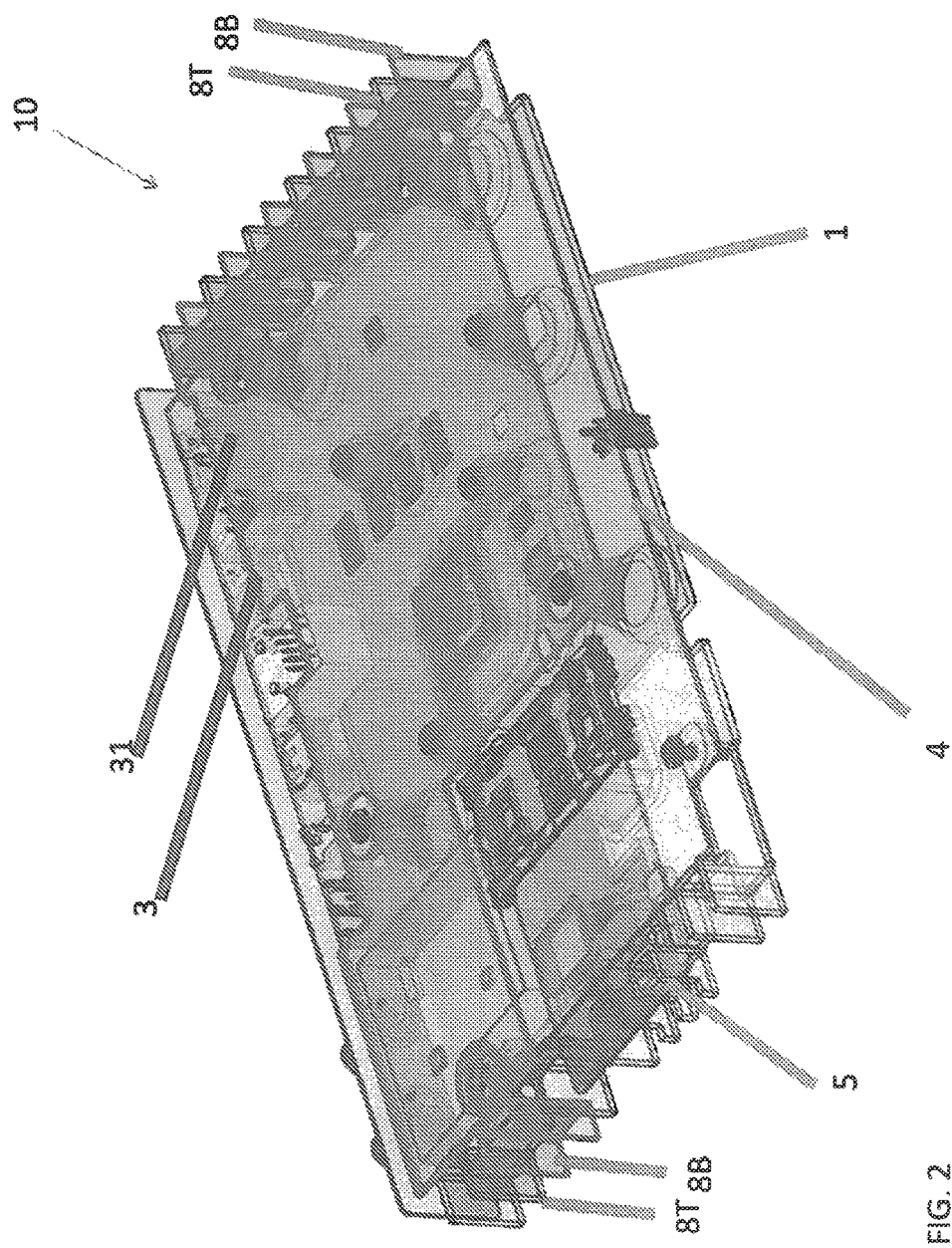
FIG. 2 is an interior bottom front perspective view of the set top box 10 according to the invention.

FIG. 2 is a bottom front perspective view with some see-through features of the set top box 10 or the like according to the invention. The bottom, top, front side, left side and right side are removed to more clearly show the interior features. In this view, a major heat generating component, the smart card/smart card assembly 5, is shown. Here, one of the heatspreaders 3 has a cutout portion in the corresponding plate portion 31 and the smart card assembly 5 is positioned in the cutout portion.

Figure 3:
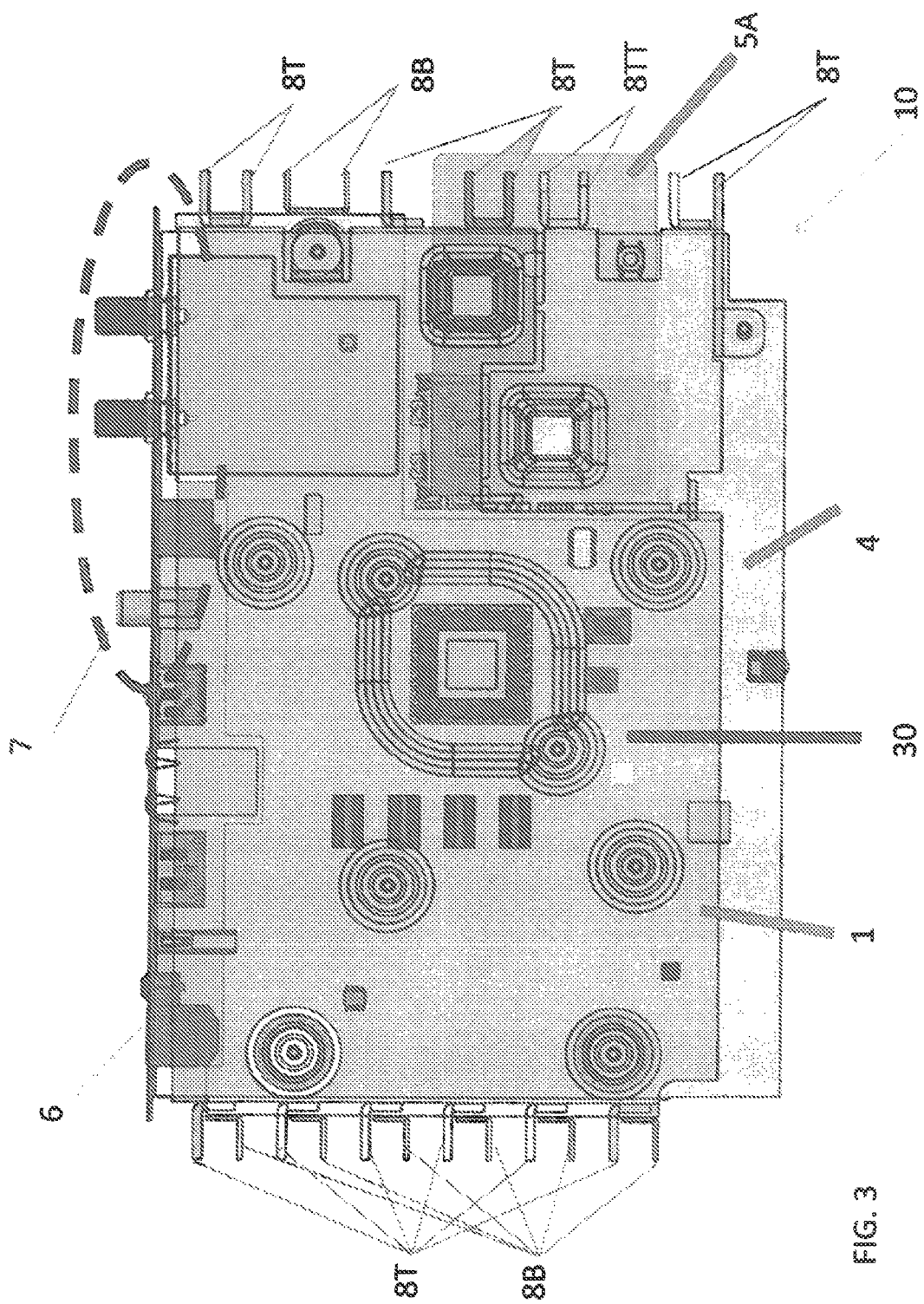
FIG. 3 is an interior top plan view of the set top box 10 according to the invention.

FIG. 3 is a top interior plan view of the device 10 showing how the top heatsink 1 and fins 8T are connected. This view further shows the fins 8B which are connected to the bottom heatsink 3 and shows how the fins 8B can be between the fins 8T. The electronic device can include a panel jack 7 with connectors on the rear wall 6. The top heatsink 1 can include a cutout portion as well to accommodate components such as smart card assemblies.

Figure 4:
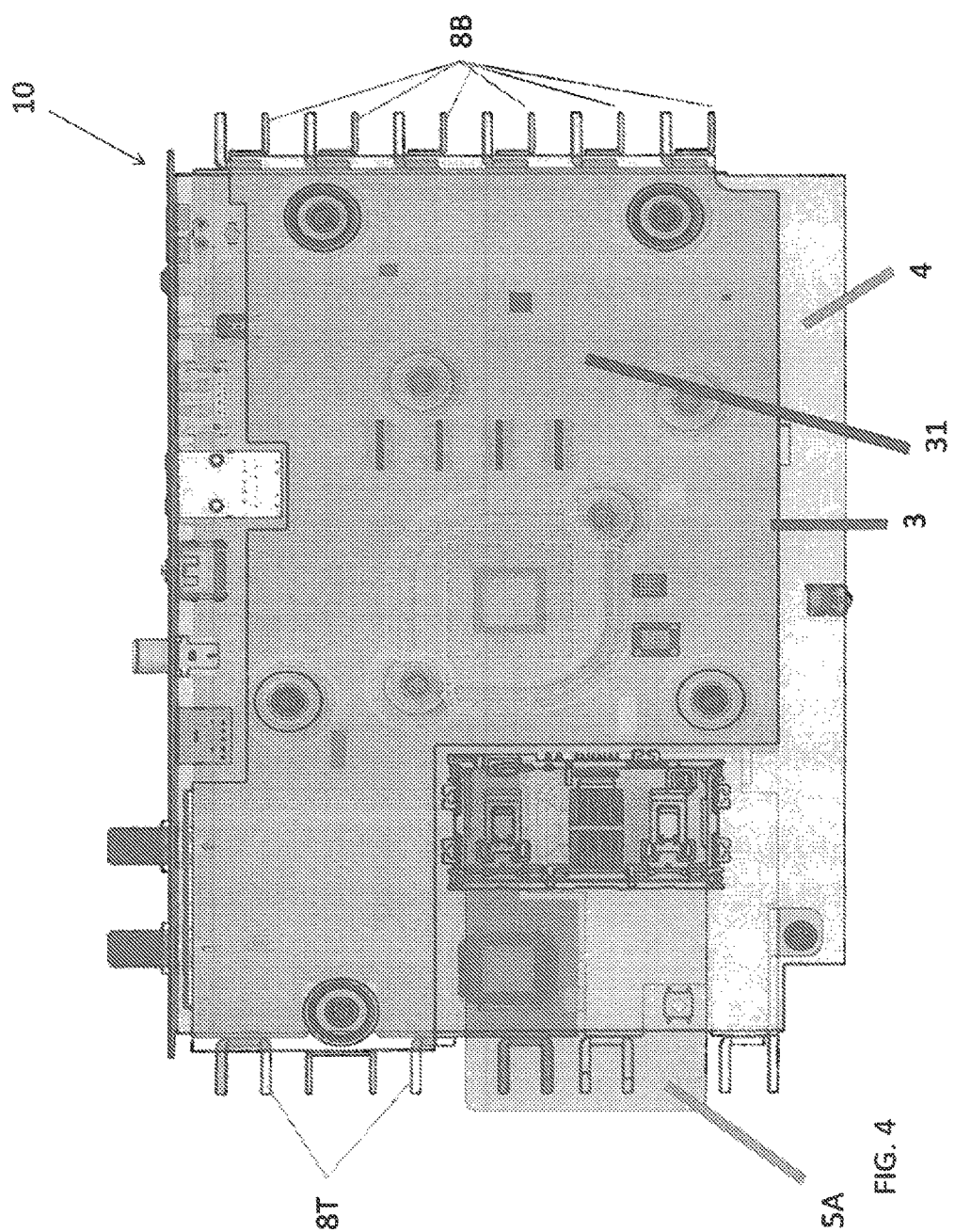
FIG. 4 is an interior bottom plan view of the set top box 10 according to the invention.

FIG. 4 is a bottom interior plan view showing how the bottom heatsink 3 and fins 8B connect.

Figure 5:
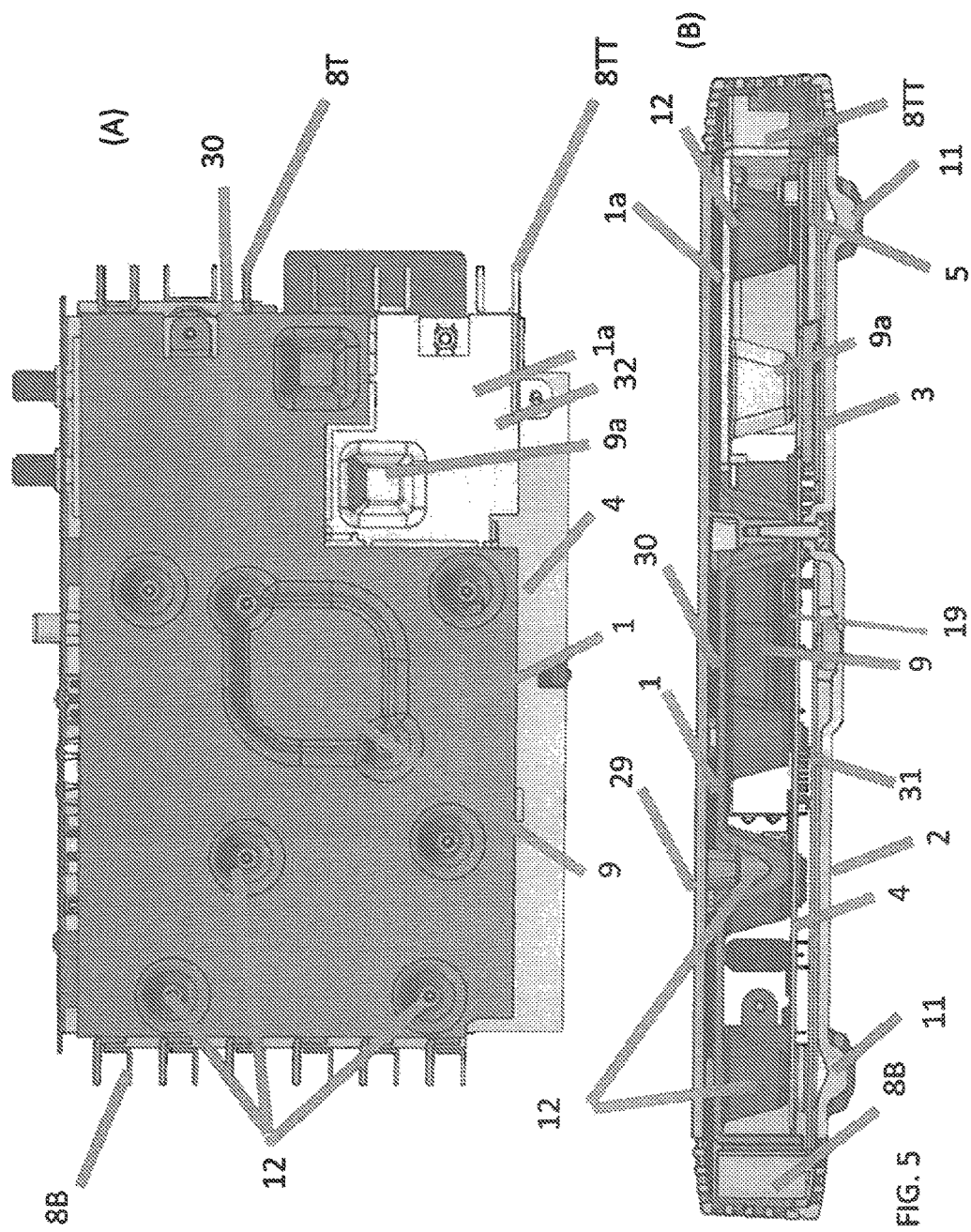
FIG. 5A is an interior top plan view and FIG. 5B is an interior sectional view according to the invention.

FIG. 5A shows a top interior plan view and FIG. 5B shows an interior sectional view of the set top box. These views show that the top heatsink 1 can be segmented in a manner in which heat from a major heat generating component such as a smart card assembly 5 can be at least partially extracted separately from heat generated by other components. The smart card assembly region can have a minor top heatsink 1a as shown, in which the expression "minor" implies a smaller heatsink than the top heatsink or implies a heatsink that is dedicated to a specific internal component. These views shows the central depression 9 of the top heatsink 1 that contacts the PCB 4 or a thermal contact pad 19 thereon to extract heat from the PCB. Likewise these views show a depression 9a for the minor top heatsink 1a that extends down from the minor planar portion 32 of the minor top heatsink 1a. The depression 9a contacts the smart card assembly 5 or the like to transfer heat to the minor top heatsink planar peripheral portion 32 which surrounds the depression 9a or part of the depression. The depression 9a works similarly to the depression 9 in how it transfers heat to the planar peripheral portions (first plate portion 30) surrounding depression 9. FIG. 5B also shows feet 11 on the set top box which allows for heat to be removed from the bottom of the set top box. The feet also allow for air circulation through convention to occur. These views show how screws in screw depressions 12 can hold the top heatsink 1 to the PCB 4 or bottom 2 and how central depressions can contact the PCB 4. Some dimensions for one of the preferred embodiments of the invention are:

the gap between the bottom 2 and the bottom heatsink 3 equal to 3 mm;

the thickness of the bottom heatsink 3 equal to 2 mm;

the dimension of the top to bottom of the electronic device equal to 38 mm;

the circuit board dimension equal to 215 mm×150 mm; and the gap between the bottom heatsink 3 to circuit board equal to 6 mm.

Figure 6:
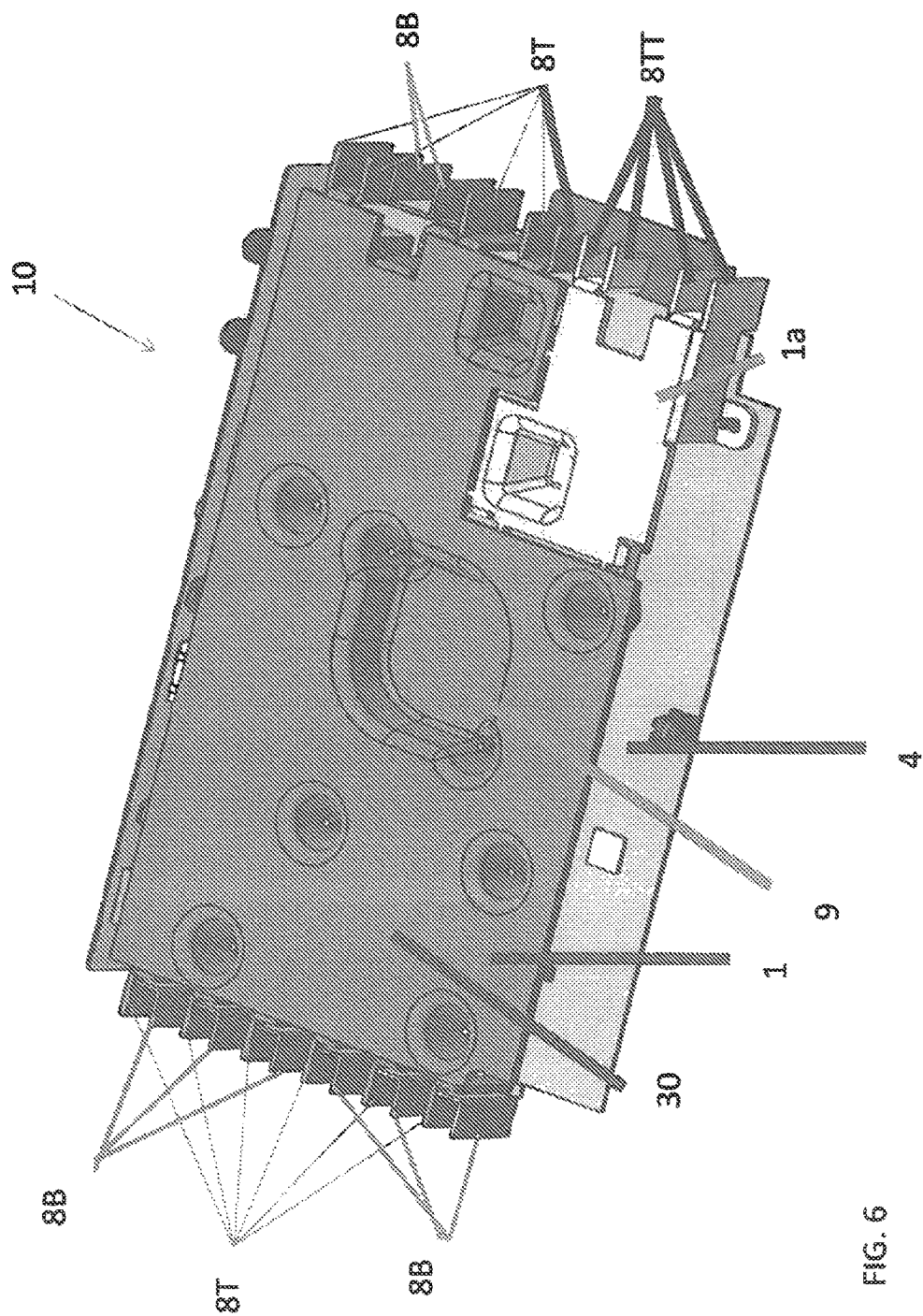
FIG. 6 is an interior top front perspective view of the set top box 10 according to the invention.

FIG. 6 is a top front perspective view of the set top box 10 or the like according to the invention. Here, fins 8B are connected to bottom heatsink 3 and fins 8T are connected to the top heatsink 1. On one side, heat is effectively extracted by having the 8B and 8T fins alternate. The spacing of the fins in general is such that it promotes convection of air and namely to promote convection of heated air out of vents in the vicinity of the fins. The fins will extract heat from the heatsinks by thermal conduction away from the central portions of the set top box. On one side of the set top box, the fins 8B and 8T can be alternating. In some cases, alternating may not be necessary. Also, the minor top heatsink 1A can have end fins 8TT. It should be mentioned that it is preferred to have the fins being vertically orientated and parallel to each other.

Figure 7:
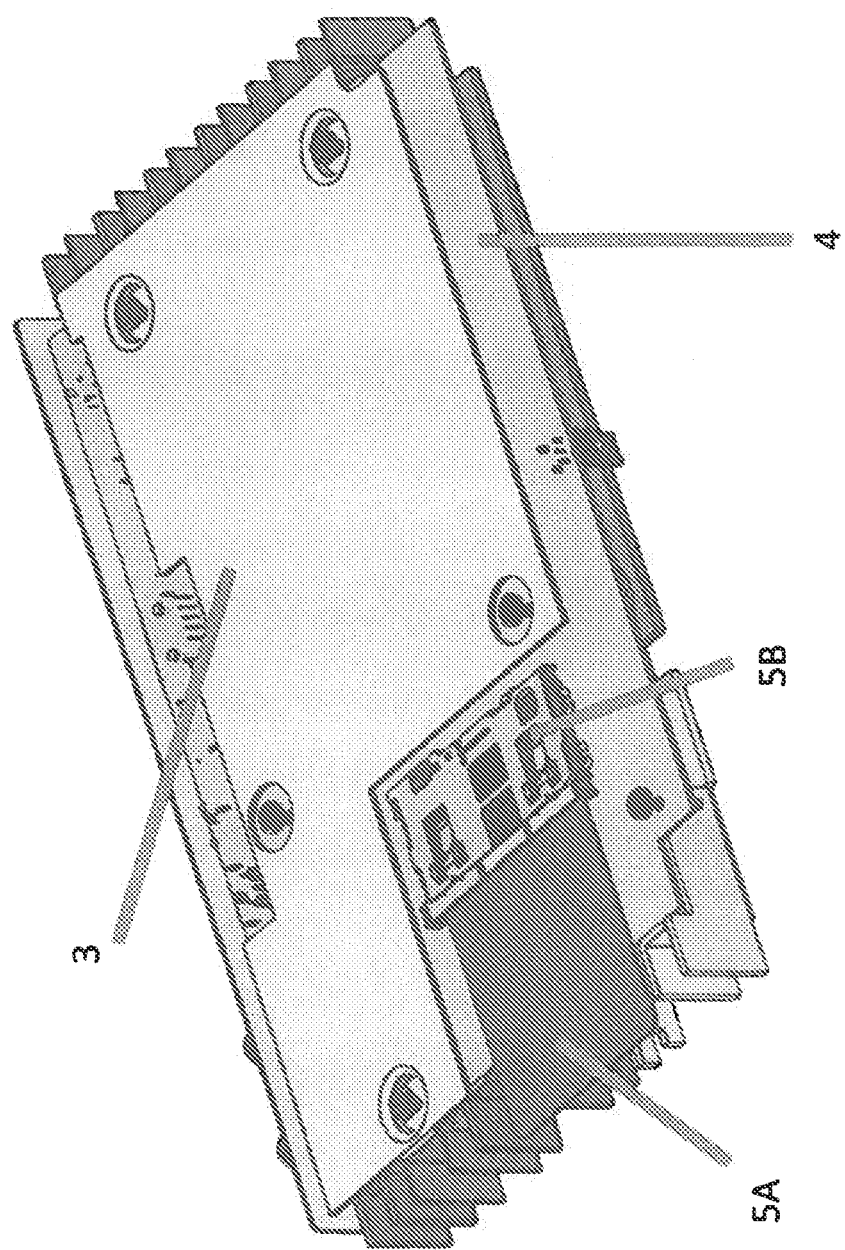
FIG. 7 is an interior bottom front perspective view of the set top box 10 according to the invention.

FIG. 7 is a bottom front perspective view without the bottom or base frame 2 of the set top box. This view shows a possible pattern for the bottom heatsink 3. Here, a peripheral planar portion of the bottom heatsink surrounds the smart card/smart card assembly 5 as shown which can include a smart card 5A and a smart card reader 5B that can be attached to the PCB 4. The function of the bottom heatsink is to further extract heat from the circuit board by transferring heat to the bottom of the set top box 10 to further permit heat to more evenly spread from the central portion of the set top box and dissipate out of the set top box and away from the set top box.

Figure 8:
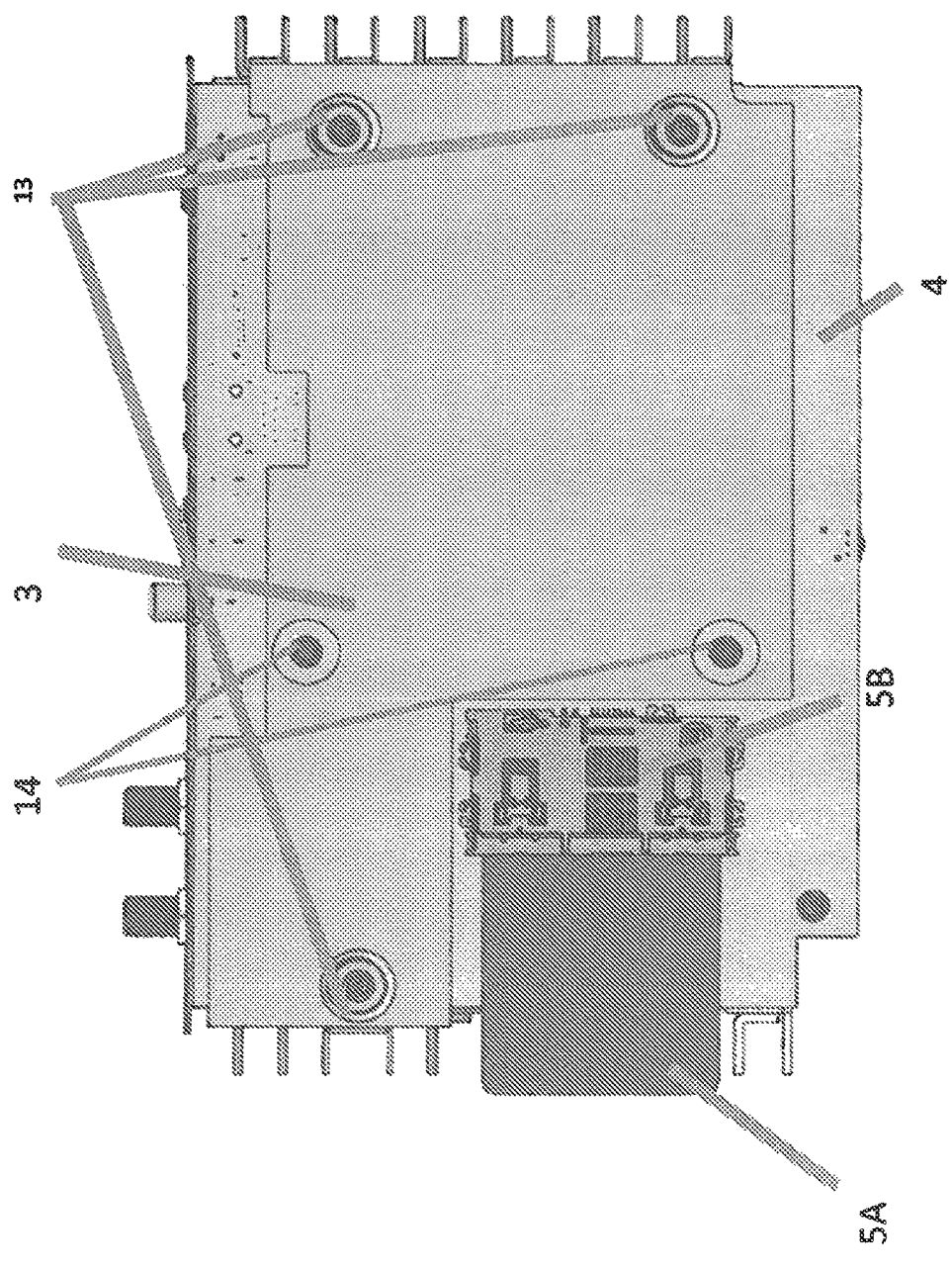
FIG. 8 is an interior solid bottom plan view without the bottom or base frame 2 of the set top box.

FIG. 8 is a solid bottom plan view without the bottom or base frame 2 of the set top box. To assist in having the bottom heatsink further extract heat from the circuit board and/or heat generating components thereon are screw assembly contacts 13, which are located in the bottom heatsink. The screw assembly contacts 13 facilitate the connection between the top heatsink, PCB, and bottom heatsink by screw, bolt or the like. These screw assembly contacts 13 can be spread around the periphery to enhance the migration of heat from the center. Through these screw assembly contacts, the top heatsink, PCB, and bottom heatsink can connect mechanically and thermally to the base 2. Please note that all or any thermal contact points can employ thermal pads 19. The set top box can also have additional throughholes 14 through any of the interior components to provide opportunities to mechanical support (through screw, bolts, rivets, clips, or the like) for any of the interior component to other interior components or the base 2.

Figure 9:
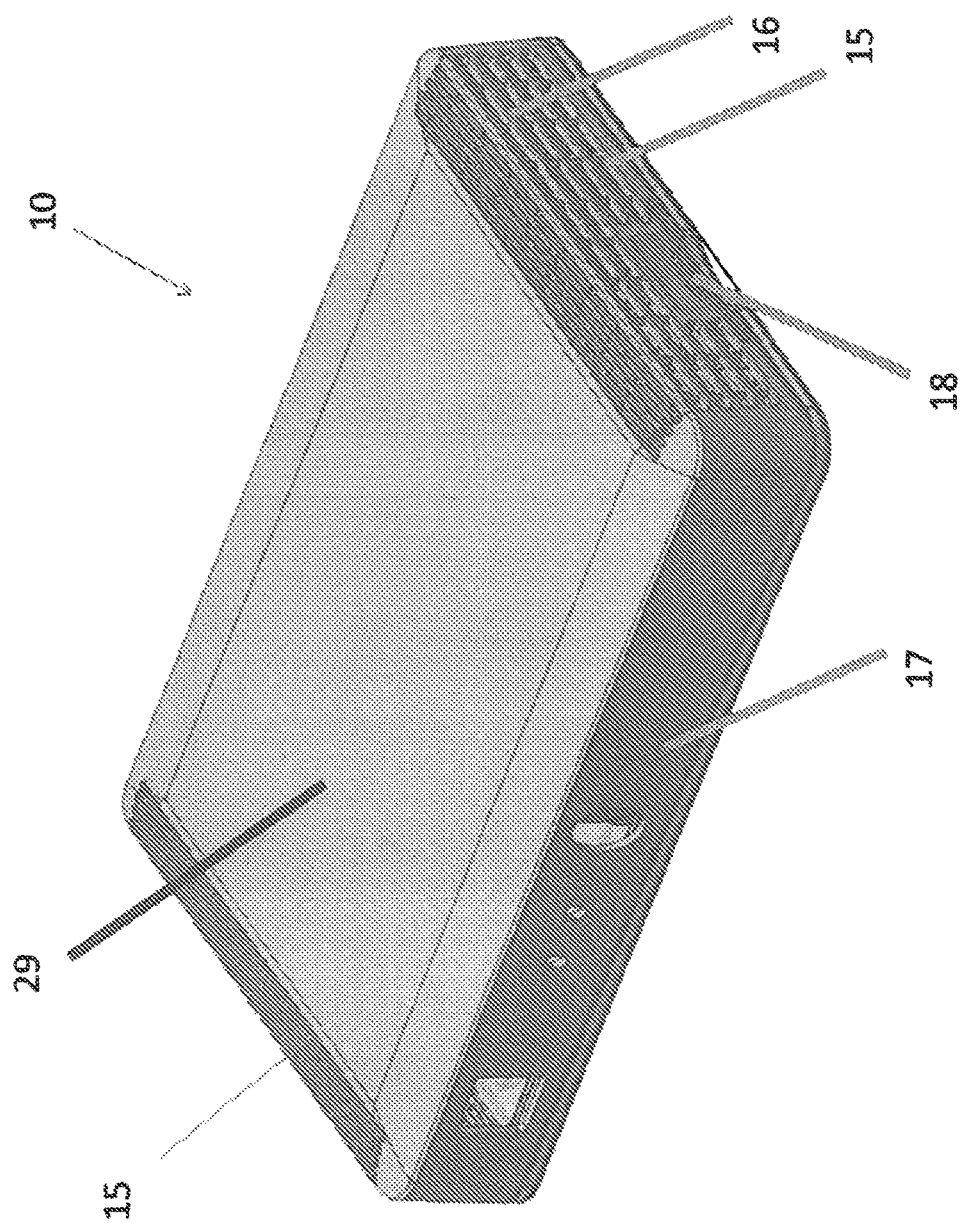
FIG. 9 is a front perspective view of the set top box according to the invention.

FIG. 9 is a front perspective view of the set top box or the like with the top 29, front 17, sides 16 assembled. In this view, elongated vents 15 are shown which can be oriented horizontally at the edges of the top 29, on sides 16, and at the edges of the bottom 2 of the set top box. The concept is to have the vents be in the vicinity of the fins to be above the fins, on the sides of the fins, and under the fins. The planes of the fins can be perpendicular to the elongated vents (which are slots). The view further shows that a side 16 can include a smartcard bay 18 which receive and hold a smart card.

Figure 10:
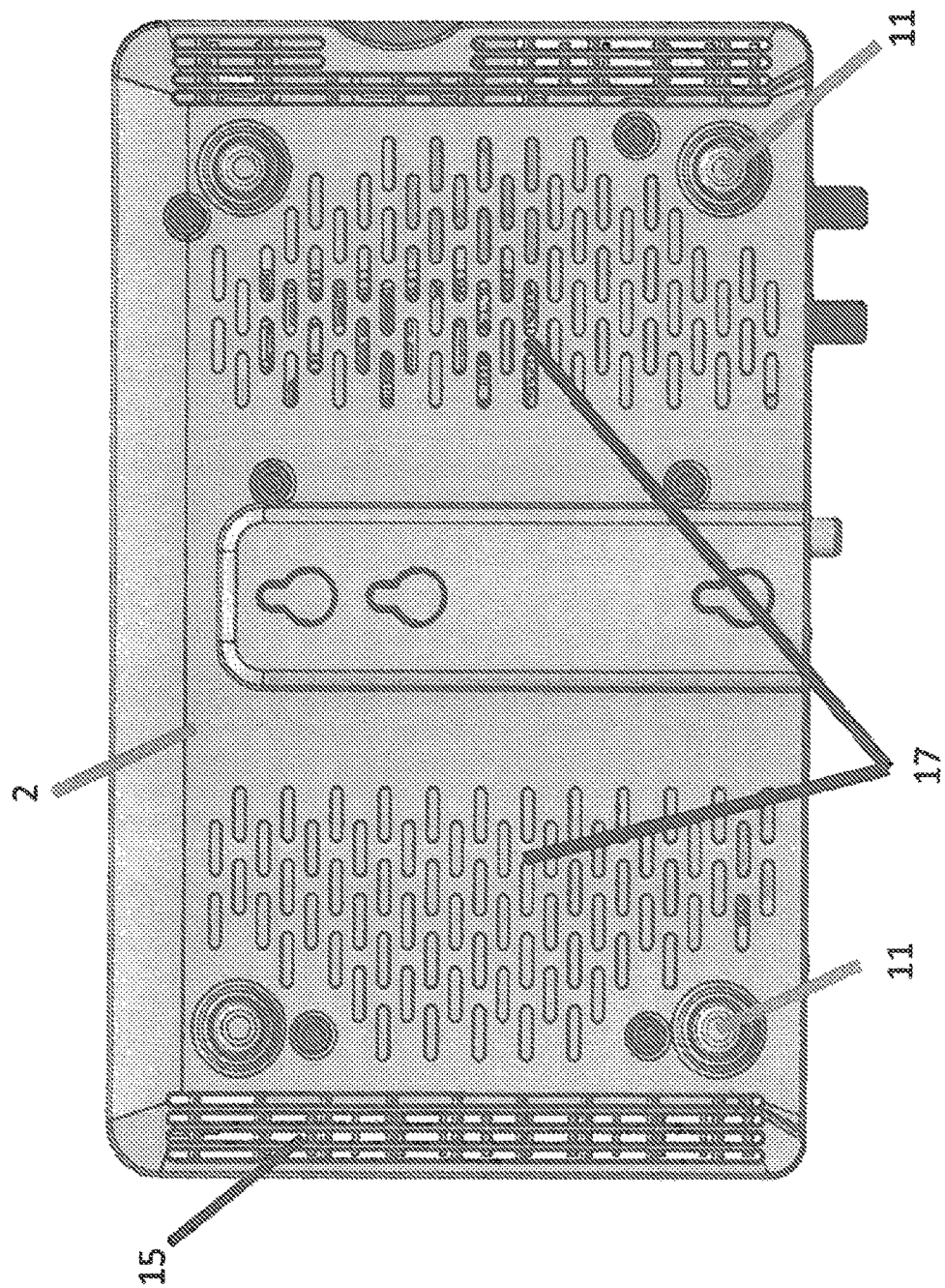
FIG. 10 is a bottom plan view of the set top box according to the invention.

FIG. 10 is a bottom plan view of the set top box showing that the set top box can further include additional vent slots 17 which can be parallel to the each other and perpendicular to the vents 15. The additional vent slots 17 are positioned between the vents 15 and positioned under the printed circuit board.

Some of the key features in the device can include having a top side heatspreader 1 attached to the main integrated circuit (IC) on the PCB in which the main IC can be the major heat generator; the top side heatspreader 1 attached to an area of the PCB where the smart card assembly contacts are positioned such that the contacts can be in a thermally sensitive area; and a bottom side heatspreader 3 being only attached to the PCB at the outer sides.

In some of the embodiments, the top side heatspreader 1 has more room above the PCB because the connectors are on the top side of the PCB. Hence, a maximum number or a necessary number of embosses can be employed to attach the top heatspreader to the PCB to draw as much heat as possible into the heatspreader.

In some embodiments, the top side smart card heatspreader 1a is minimally attached to the PCB with only one screw emboss and one emboss joined to the PCB via a thermal pad.

Generally, the bottom side heatspreader does not have much room under the PCB so the center of this heatspreader does not have any embosses to the PCB in some embodiments.

The bottom heatspreader can also function as a radiation shield for the bottom of the enclosure. The radiation is absorbed by the heatspreader and heat is conducted throughout to prevent hot spots on the bottom of the enclosure. There can be some embosses on the bottom heatspreader 3 to the PCB on the sides or periphery of the PCB, where the heat is less concentrated.

An important feature of the embodiments is that all the heatspreaders can have a series of vertical fins formed on the sides that overhang the PCB. Since many prefer or require no vent openings directly above the PCB, these fins are outboard of the PCB and the associated vents 15 are also outboard of the PCB horizontal profile. The vents 15 can be in the bottom, top and sides of the enclosure in those outboard areas. This allows the intake of cooling air from the bottom and allows the exhaust of heated air through the top due to natural convection.

Thermal finite element analysis (FEA) simulations have been performed on set top boxes according to the disclosed embodiments. The simulations have shown that the heat management system according to the invention is effective at dissipating heat. In particular, set top boxes generating up to 18 Watts of power have been able to safely allow the device to reach and stay at a favorable steady state condition using the disclosed heat management system. In particular, the heatsinks/heatspreaders were effective and helped to achieve and create favorable steady state conditions in which (1) the hot spot on the circuit board was under the thermal pad and was about 71.0 C, (2) the hot spot of top heatsink was at its center and was about 66.1 C with the center of the top heatsink contacting the circuit board and/or the thermal pad thereon, and (3) the fins of the top heatsink reached and stayed at temperatures of around 59 C. At these steady state temperature values, heat was effectively removed via the fins 8 through the vents 15.

The invention can include the feature of the fins attached to the top heatsink and bottom heatsink alternating along the entire lengths of the shorts sides of the set top box. Such a configuration can be employed on one side or both sides.

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An electronic device comprising:
a printed circuit board;
a first heatspreader having a first plate portion and first fins along two sides of the first plate portion, the first plate portion above the printed circuit board; and
a second heatspreader having a second plate portion and second fins along two sides of the second plate portion, the second plate portion below the printed circuit board;
wherein the first heatspreader has a cutout portion in a plane of the first plate portion;
a third heatspreader associated with a smart card assembly, the third heatspreader having a third plate portion, the third plate portion positioned in the cutout portion in the first plate portion.

2. The electronic device of claim 1 wherein the third plate portion has additional fins along one side of the third plate portion.

3. The electronic device of claim 1 further comprising exterior sides and at least one of the exterior sides has at least one vent positioned adjacent to at least one of the fins.

4. The electronic device of claim 1 wherein the first fins are oriented vertically and are parallel to each other.

5. The electronic device of claim 1 wherein the second fins are oriented vertically and are parallel to each other.

6. The electronic device of claim 1 wherein the first and second fins are oriented vertically and are parallel to each other.

7. The electronic device of claim 1 wherein a plurality of the first and second fins alternate with one another along both sides of the first and second plate portions.

8. The electronic device of claim 6 further comprising a plurality of the exterior sides having at least one vent positioned adjacent to the fins, wherein the vents are oriented perpendicularly to the fins.

9. The electronic device of claim 6 further comprising a plurality of the exterior vertical sides, a top and bottom, wherein two of the exterior vertical sides and edge portions of the top and bottom having a plurality of vents positioned adjacent to the fins, wherein the vents are perpendicular to the fins.

10. The electronic device of claim 6 further comprising:
    a bottom portion of the electronic device having first vents positioned adjacent to the fins at opposite edges of the bottom portion; and
    second vents between the first vents.

11. The electronic device of claim 10 wherein the first vents are elongated and are perpendicular to the fins and the second vents are elongated and are parallel to the fins.

12. The electronic device of claim 11 wherein the first vents positioned adjacent to the fins at opposite edges of the bottom and second vents between the first vents.

* * * * *